United States Patent
Luo et al.

(10) Patent No.: US 10,558,283 B2
(45) Date of Patent: Feb. 11, 2020

(54) TOUCH-CONTROL PHOTOSENSITIVE STRUCTURE FOR PREVENTING RED LIGHT LEAKAGE

(71) Applicants: Interface Technology (ChengDu) Co., Ltd., Chengdu, Sichuan (CN); Interface Optoelectronics (ShenZhen) Co., Ltd., Shenzhen (CN); General Interface Solution Limited, Zhunan Township, Miaoli County (TW)

(72) Inventors: Yong Luo, Shenzhen (CN); Shang-Yu Huang, Zhunan Township, Miaoli County (TW)

(73) Assignees: INTERFACE TECHNOLOGY (CHENGDU) CO., LTD., Chengdu, Sichuan (CN); INTERFACE OPTOELECTRONICS (SHENZHEN) CO., LTD., Shenzhen (CN); GENERAL INTERFACE SOLUTION LIMITED, Miaoli County (TW)

( * ) Notice: Subject to any disclaimer, the term of this patent is extended or adjusted under 35 U.S.C. 154(b) by 0 days.

(21) Appl. No.: 15/980,139

(22) Filed: May 15, 2018

(65) Prior Publication Data
US 2019/0286258 A1    Sep. 19, 2019

(30) Foreign Application Priority Data
Mar. 15, 2018  (CN) .......................... 2018 1 0215121

(51) Int. Cl.
*G06F 3/041* (2006.01)
*H05K 1/05* (2006.01)
(Continued)

(52) U.S. Cl.
CPC ............... *G06F 3/041* (2013.01); *H05K 1/05* (2013.01); *G02B 5/003* (2013.01); *G02B 5/22* (2013.01); *H05K 2201/0326* (2013.01)

(58) Field of Classification Search
USPC .................................................. 345/173–178
See application file for complete search history.

(56) References Cited

U.S. PATENT DOCUMENTS

2014/0125603 A1*  5/2014  Lin ................... H01L 31/02168
                                                          345/173
2016/0306460 A1* 10/2016  Lee ....................... H01L 27/323
(Continued)

*Primary Examiner* — Roy P Rabindranath
(74) *Attorney, Agent, or Firm* — Muncy, Geissler, Olds & Lowe, P.C.

(57) ABSTRACT

A touch-control photosensitive structure for preventing red light leakage includes a metal substrate, an insulating layer, a photosensitive layer, a third metal layer and a transparent conductive layer. The insulating layer is disposed on the metal substrate. The photosensitive layer is disposed on the insulating layer. The photosensitive layer at least comprises red photosensitive blocks, green photosensitive blocks and blue photosensitive blocks, arranged alternately. A junction region is disposed at the junction of the photosensitive blocks in different colors. The third metal layer is disposed on the junction region. The third metal layer has a lower surface which a light absorption layer is disposed on. The light absorption layer absorbs a reflecting light otherwise reflecting off the metal substrate and the third metal layer and propagating therebetween. The transparent conductive layer is disposed on the third metal layer. The third metal layer reduces impedance of the transparent conductive layer efficiently and thereby renders public voltage stable. The light absorption layer absorbs the reflecting light and thereby prevents light leakage.

10 Claims, 6 Drawing Sheets

(51) Int. Cl.
G02B 5/00 (2006.01)
G02B 5/22 (2006.01)

(56) References Cited

U.S. PATENT DOCUMENTS

2017/0123542 A1* 5/2017 Xie .................. H01L 21/77
2019/0137874 A1* 5/2019 Aridomi ............ C08F 290/12

* cited by examiner

TOUCH-CONTROL PHOTOSENSITIVE STRUCTURE FOR PREVENTING RED LIGHT LEAKAGE

CROSS REFERENCE

This non-provisional application claims priority from China Patent Application NO. 201810215121.6 filed on Mar. 15, 2018, the content thereof is incorporated by reference herein.

BACKGROUND OF THE INVENTION

Field of the Invention

The present invention relates to the field of touchscreens and, more particularly, to a touch-control photosensitive structure for preventing red light leakage and reducing sensing electrode impedance.

Description of the Prior Art

Electronic devices capable of touch control are good at human-machine interactions by allowing a user to operate them with a finger or a stylus; hence, they are popular with consumers. Conventional touchscreens usually have an indium tin oxide (ITO) transparent electrode that functions as a sensing electrode. When the user's finger or stylus touches the touchscreen, a non-uniform electrical field generated at a point of touch on the touchscreen allows the point of touch to be identified, and thus the touchscreen displays a related task by circuits and operating software.

Since the ITO transparent electrode has higher impedance than conventional metal wiring, some commercially-available touchscreens have a metal layer disposed beneath the ITO transparent electrode to reduce the impedance of the transparent conductive layer. Referring to FIG. 1, there is shown a cross-sectional, schematic view of a touch-control photosensitive structure 10 with an impedance-reducing metal layer. The touch-control photosensitive structure 10 comprises a metal substrate 20, an insulating layer 30, a photosensitive layer 40, a metal layer 50 and a transparent conductive layer 60. The metal layer 50 reduces the impedance of the transparent conductive layer 60 efficiently and thereby renders public voltage stable.

However, metallic surfaces reflect light readily, and thus the leaking light reflects off the metal substrate 20 and the metal layer 50 repeatedly to therefore propagate therebetween. Both blue light and green light are absorbed and dissipated gradually in the course of reflection readily. By contrast, red light has the longest wavelength and thus is unlikely to be absorbed and dissipated in the course of reflection. Hence, red light leaks out of the edges of touchscreens readily, thereby rendering the touchscreens reddish. In view of this, the conventional touch-control photosensitive structure still has room for improvement.

SUMMARY OF THE INVENTION

It is an objective of the present invention to provide a touch-control photosensitive structure for preventing red light leakage, so as to not only reduce the impedance of a transparent conductive layer of the touch-control photosensitive structure efficiently, but also prevent light leakage.

In order to achieve the above and other objectives, the present invention provides a touch-control photosensitive structure for preventing red light leakage, comprising: a metal substrate, an insulating layer, a photosensitive layer, a third metal layer and a transparent conductive layer. The metal substrate comprises a plurality of first metal layers and a plurality of second metal layers disposed between two adjacent ones of the first metal layers. The insulating layer is disposed on the metal substrate. The photosensitive layer is disposed on the insulating layer. The photosensitive layer at least comprises a plurality of red photosensitive blocks, a plurality of green photosensitive blocks and a plurality of blue photosensitive blocks, wherein not only are each red photosensitive block, a corresponding one of the green photosensitive blocks and a corresponding one of the blue photosensitive blocks alternate with each other, but a junction region is also disposed at a junction of the photosensitive blocks in different colors to distinguish between the photosensitive blocks. The third metal layer is disposed on the junction region and having a lower surface which a light absorption layer is disposed on, with the light absorption layer adapted to absorb a reflecting light otherwise reflecting off the metal substrate and the third metal layer and propagating therebetween. The transparent conductive layer is disposed on the third metal layer.

The present invention also provides another touch-control photosensitive structure for preventing red light leakage, comprising: a metal substrate, an insulating layer, a photosensitive layer, a third metal layer and a transparent conductive layer. The metal substrate comprises a plurality of first metal layers and a plurality of second metal layers disposed between two adjacent ones of the first metal layers. The insulating layer is disposed on the metal substrate. The photosensitive layer is disposed on the insulating layer, the photosensitive layer at least comprising a plurality of red photosensitive blocks, a plurality of green photosensitive blocks and a plurality of blue photosensitive blocks, wherein not only are each red photosensitive block, a corresponding one of the green photosensitive blocks and a corresponding one of the blue photosensitive blocks alternate with each other, but a junction region is also disposed at a junction of the photosensitive blocks in different colors to distinguish between the photosensitive blocks. The third metal layer is disposed on the junction region. The transparent conductive layer is disposed on the third metal layer, wherein the metal substrate has an upper surface which a light absorption layer is disposed on, with the light absorption layer adapted to absorb a reflecting light otherwise reflecting off the metal substrate and the third metal layer and propagating therebetween.

DETAILED DESCRIPTION OF THE EMBODIMENTS

Features and functions of the technical means and structures applied to the present invention to achieve the aforesaid objectives and effects are depicted by drawings, illustrated with preferred embodiments, and described below so as to be fully comprehensible but not restrictive of the present invention.

Figure 1:
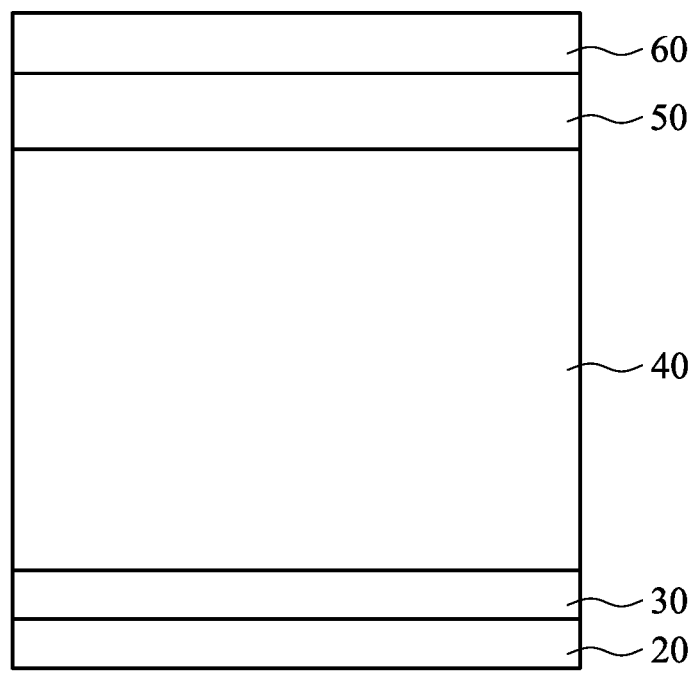
FIG. 1 (PRIOR ART) is a cross-sectional, schematic view of a touch-control photosensitive structure with an impedance-reducing metal layer.
Figure 2:
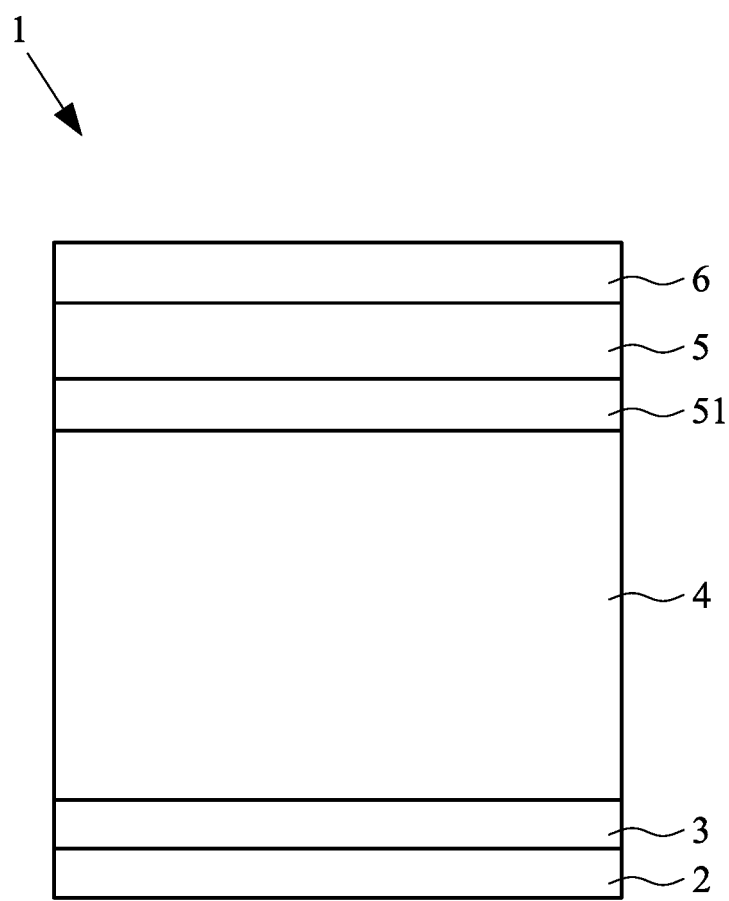
FIG. 2 is a cross-sectional, schematic view of a touch-control photosensitive structure for preventing red light leakage according to a preferred embodiment of the present invention.
Figure 3:
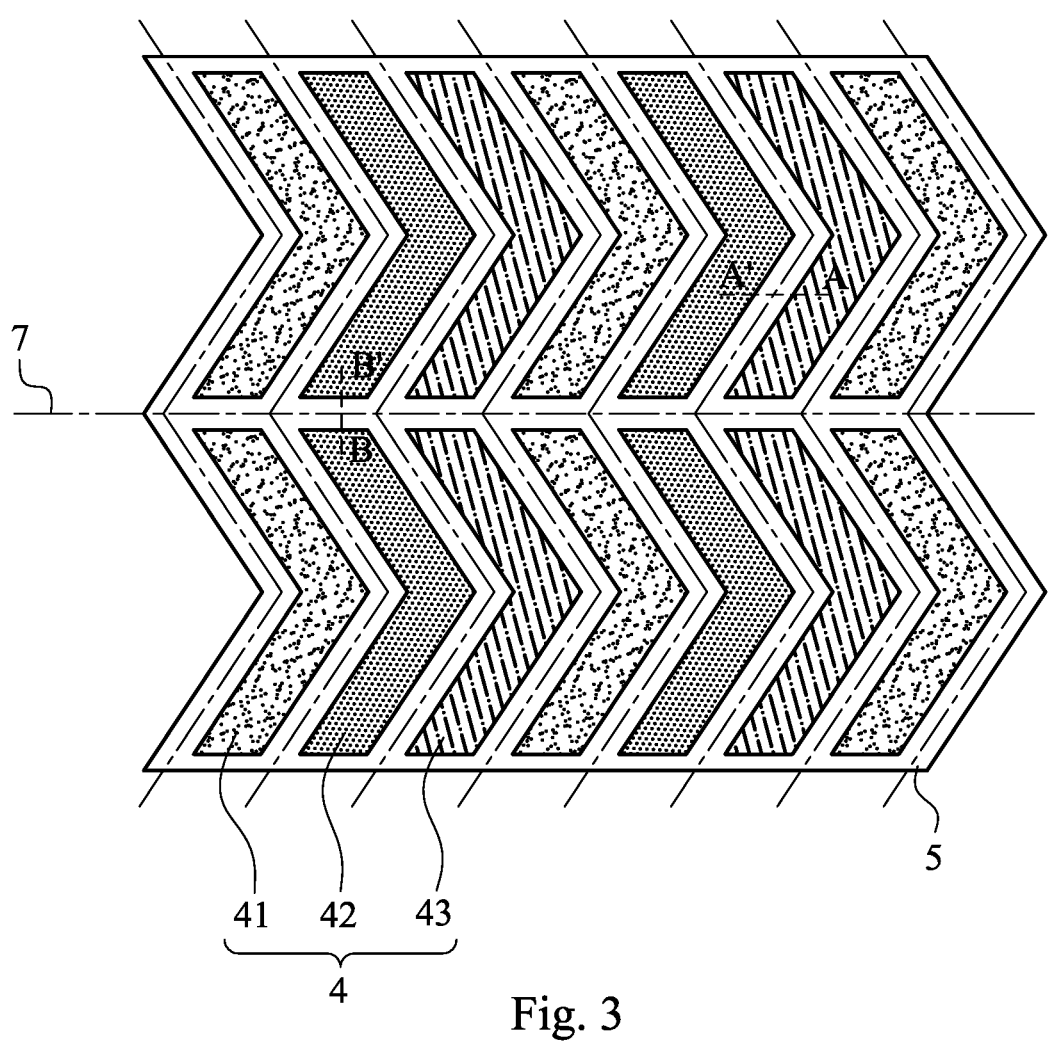
FIG. 3 is a top view of the touch-control photosensitive structure for preventing red light leakage according to the preferred embodiment of the present invention, showing a third metal layer and a photosensitive layer.
Figure 4A:
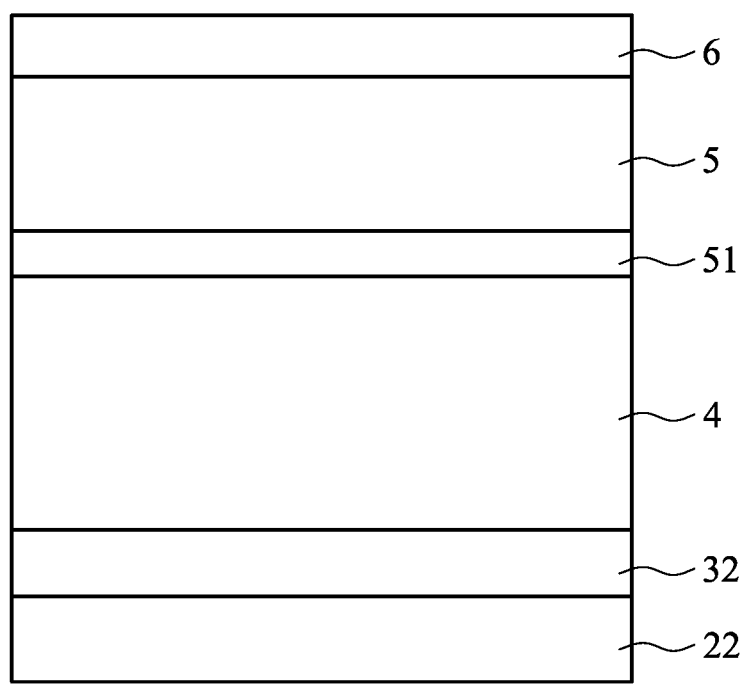
FIG. 4A is a cross-sectional view of the touch-control photosensitive structure for preventing red light leakage, taken along line A-A' of FIG. 3, according to the preferred embodiment of the present invention.
Figure 4B:
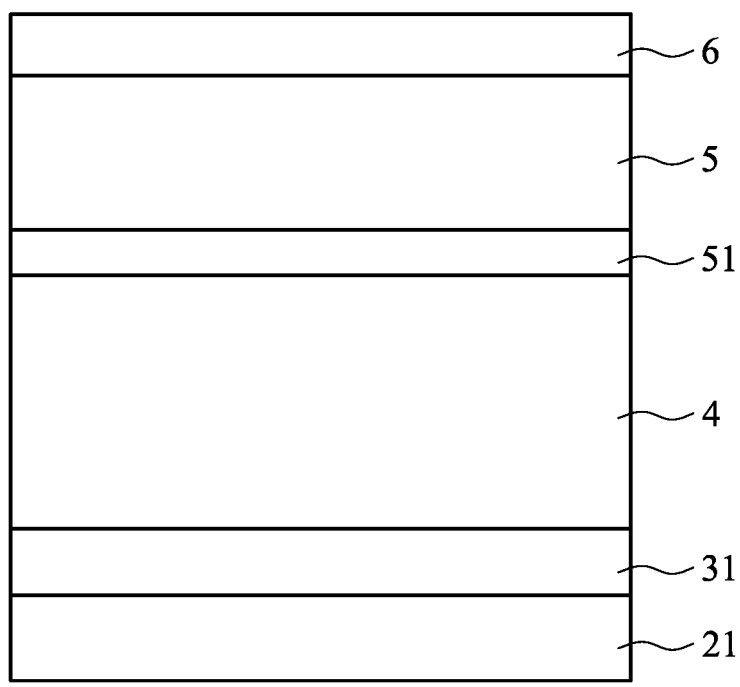
FIG. 4B is a cross-sectional view of the touch-control photosensitive structure for preventing red light leakage, taken along line B-B' of FIG. 3, according to the preferred embodiment of the present invention.

Referring to FIG. 2, FIG. 3, FIG. 4A and FIG. 4B, there are shown a cross-sectional, schematic view of a touch-control photosensitive structure 1 for preventing red light leakage according to a preferred embodiment of the present invention, a top view of the touch-control photosensitive structure 1, showing a third metal layer and a photosensitive layer, a cross-sectional view of the touch-control photosensitive structure 1 taken along line A-A' of FIG. 3, and a cross-sectional view of the touch-control photosensitive structure 1 taken along line B-B' of FIG. 3. According to the present invention, the touch-control photosensitive structure 1 for preventing red light leakage is applicable to a touchscreen (not shown). The touch-control photosensitive structure 1 comprises a metal substrate 2, an insulating layer 3, a photosensitive layer 4, a third metal layer 5 and a transparent conductive layer 6.

The metal substrate 2 comprises a plurality of first metal layers 21 and a plurality of second metal layers 22 disposed between two adjacent ones of the first metal layers 21. The first metal layers 21 and the second metal layers 22 are made of copper metal or copper alloy, but the present invention is not limited thereto.

The insulating layer 3 is disposed on the metal substrate 2 and is a thin film or a coating, serving insulating and isolating purposes. In the preferred embodiment of the present invention, the insulating layer on the first metal layers 21 is a GI layer 31 (gate insulating layer), whereas the insulating layer on the second metal layers 22 is a PAS layer 32 (passivation layer).

The photosensitive layer 4 is disposed on the insulating layer 3. The photosensitive layer 4 at least comprises a plurality of red photosensitive blocks 41, a plurality of green photosensitive blocks 42 and a plurality of blue photosensitive blocks 43. Each red photosensitive block 41, a corresponding one of the green photosensitive blocks 42 and a corresponding one of the blue photosensitive blocks 43 alternate with each other. A junction region 7 is disposed at the junction of the photosensitive blocks in different colors to distinguish between the photosensitive blocks.

The third metal layer 5 is disposed on the junction region 7. The transparent conductive layer 6 is disposed on the third metal layer 5. The transparent conductive layer 6 is made of metal doped oxide, carbon nanotube, conductive polymer or graphene. The transparent conductive layer 6 is preferably an indium tin oxide (ITO) transparent electrode. Indium tin oxide has a low resistance ratio, high transmittance, and high weatherability, and thus ITO is a transparent conductive material in wide use. The third metal layer 5 is disposed along the junction region 7 to reduce the impedance of the transparent conductive layer 6 efficiently and thereby render public voltage stable.

The third metal layer 5 has a lower surface which a light absorption layer 51 is disposed on. The light absorption layer 51 absorbs a reflecting light otherwise reflecting off the metal substrate 2 and the third metal layer 5 and propagating therebetween. In this preferred embodiment, the light absorption layer 51 is a metal oxide of the third metal layer 5, for example, copper oxide, which is black oxide and thus absorbs light efficiently.

In general, light scattering or leaking out of the edges of the photosensitive layer 4 is absorbed by a border ink layer of the touchscreen. Owing to the third metal layer 5, the leaking light reflects off the metal substrate 2 and the third metal layer 5 repeatedly. The leaking light comprises red light, green light and blue light. Both green light and blue light have short wavelength and thus are absorbed and dissipated gradually in the course of repeated reflection readily. By contrast, red light has the longest wavelength and thus is unlikely to be absorbed and dissipated in the course of reflection, thereby leading to light leakage. Hence, the light absorption layer 51 disposed on the lower surface of the third metal layer 5 absorbs a reflecting light efficiently without affecting the reduction in the impedance of the transparent conductive layer 6.

In an embodiment of the present invention, the light absorption layer 51 is made of a black composite.

In an embodiment of the present invention, the light absorption layer 51 is a metal layer made of titanium.

In an embodiment of the present invention, the light absorption layer 51 is a color filter.

In an embodiment of the present invention, the light absorption layer 51 is made of a black matrix.

Figure 5:
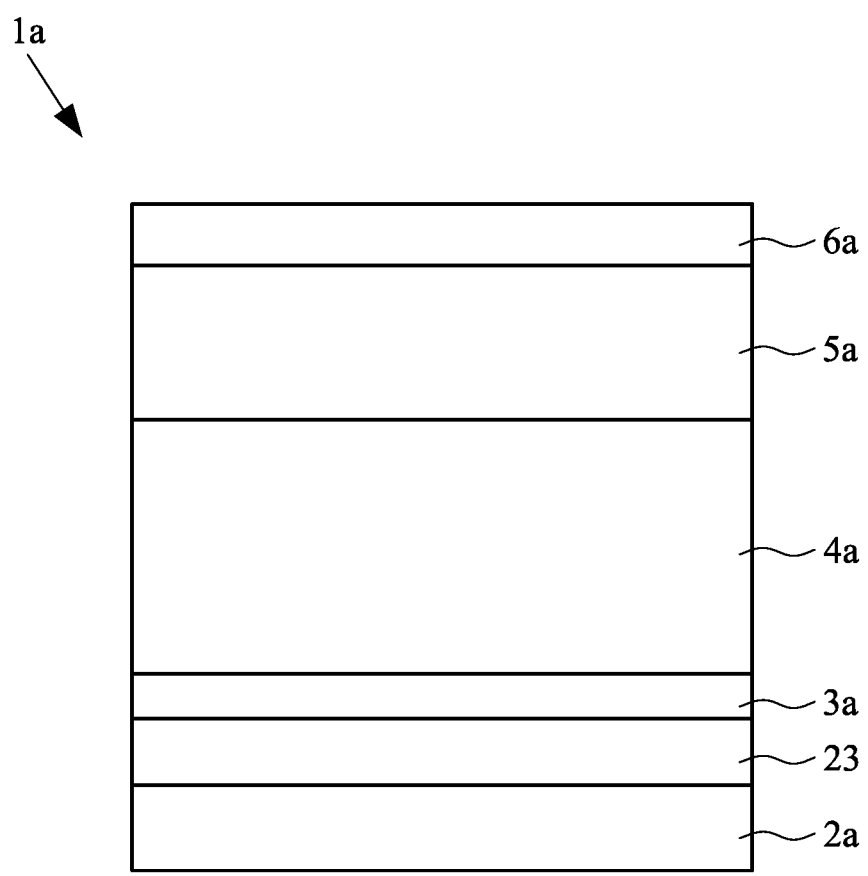
FIG. 5 is a cross-sectional, schematic view of the touch-control photosensitive structure for preventing red light leakage according to a second embodiment of the present invention.

Referring to FIG. 5, there is shown a cross-sectional, schematic view of the touch-control photosensitive structure for preventing red light leakage according to a second embodiment of the present invention. The second embodiment, which is similar to the preferred embodiment, discloses a touch-control photosensitive structure 1a for preventing red light leakage, comprising a metal substrate 2a, an insulating layer 3a, a photosensitive layer 4a, a third metal layer 5a and a transparent conductive layer 6a.

The metal substrate 2a comprises a plurality of first metal layers and a plurality of second metal layers disposed between two adjacent ones of the first metal layers. The first metal layers and the second metal layers are made of copper metal or copper alloy, but the present invention is not limited thereto.

The insulating layer 3a is disposed on the metal substrate 2a and is a thin film or a coating, serving insulating and isolating purposes.

The photosensitive layer 4a is disposed on the insulating layer 3a. The photosensitive layer 4a in the second embodiment is similar to the photosensitive layer in the preferred embodiment, that is, not only do each red photosensitive block, a corresponding one of the green photosensitive blocks and a corresponding one of the blue photosensitive blocks alternate with each other, but a junction region is also disposed at the junction of the photosensitive blocks in different colors to distinguish between the photosensitive blocks.

The third metal layer 5a is disposed on the junction region. The transparent conductive layer 6a is disposed on the third metal layer 5a. The transparent conductive layer 6a is made of metal doped oxide, carbon nanotube, conductive polymer or graphene. The transparent conductive layer 6a is preferably an ITO transparent electrode. Indium tin oxide (ITO) has a low resistance ratio, high transmittance, and high weatherability, and thus ITO is a transparent conductive material in wide use. The third metal layer 5a is disposed along the junction region to reduce the impedance of the transparent conductive layer 6a efficiently and thereby render public voltage stable.

The metal substrate 2a has an upper surface which a light absorption layer 23 is disposed on. The light absorption layer 23 corresponds in position to the junction region and extends together with the third metal layer 5a along the same vertical extension line of the upper surface of the metal substrate 2a. The light absorption layer 23 absorbs a reflecting light otherwise reflecting off the metal substrate 2a and the third metal layer 5a and propagating therebetween. Preferably, the light absorption layer 23 is a metal oxide of the third metal layer 5a, for example, copper oxide, which is black oxide and thus absorbs light efficiently.

In an embodiment of the present invention, the light absorption layer 23 is made of a black composite.

In an embodiment of the present invention, the light absorption layer 23 is a metal layer made of iron, manganese or chromium.

In an embodiment of the present invention, the light absorption layer 23 is a color filter.

In an embodiment of the present invention, the light absorption layer 23 is made of a black matrix.

Referring to the accompanying drawings, a touch-control photosensitive structure for preventing red light leakage according to the present invention features a light absorption layer, a third metal layer and a transparent conductive layer to prevent light leakage without affecting reduction of the impedance of the transparent conductive layer by the third metal layer.

The above detailed description sufficiently shows that the present invention has non-obviousness and novelty and thus meets patentability requirements. However, the aforesaid preferred embodiments are illustrative of the present invention only, but should not be interpreted as restrictive of the scope of the present invention. Hence, all equivalent changes and modifications made to the aforesaid embodiments should fall within the scope of the claims of the present invention.

What is claimed is:

1. A touch-control photosensitive structure for preventing red light leakage, comprising:
   a metal substrate comprising a plurality of first metal layers and a plurality of second metal layers disposed between two adjacent ones of the first metal layers;
   an insulating layer disposed on the metal substrate;
   a photosensitive layer disposed on the insulating layer, the photosensitive layer at least comprising a plurality of red photosensitive blocks, a plurality of green photosensitive blocks and a plurality of blue photosensitive blocks, wherein not only are each red photosensitive block, a corresponding one of the green photosensitive blocks and a corresponding one of the blue photosensitive blocks alternate with each other, but a junction region is also disposed at a junction of the photosensitive blocks in different colors to distinguish between the photosensitive blocks;
   a third metal layer disposed on the junction region and having a lower surface which a light absorption layer is disposed on, with the light absorption layer adapted to absorb a reflecting light otherwise reflecting off the metal substrate and the third metal layer and propagating therebetween; and
   a transparent conductive layer disposed on the third metal layer.

2. The touch-control photosensitive structure for preventing red light leakage according to claim 1, wherein the light absorption layer is a metal oxide of the third metal layer.

3. The touch-control photosensitive structure for preventing red light leakage according to claim 1, wherein the light absorption layer is made of one of a black composite and a black matrix.

4. The touch-control photosensitive structure for preventing red light leakage according to claim 1, wherein the light absorption layer is a color filter.

5. The touch-control photosensitive structure for preventing red light leakage according to claim 1, wherein the light absorption layer is a metal layer made of titanium.

6. A touch-control photosensitive structure for preventing red light leakage, comprising:
   a metal substrate comprising a plurality of first metal layers and a plurality of second metal layers disposed between two adjacent ones of the first metal layers;
   an insulating layer disposed on the metal substrate;
   a photosensitive layer disposed on the insulating layer, the photosensitive layer at least comprising a plurality of red photosensitive blocks, a plurality of green photosensitive blocks and a plurality of blue photosensitive blocks, wherein not only are each red photosensitive block, a corresponding one of the green photosensitive blocks and a corresponding one of the blue photosensitive blocks alternate with each other, but a junction region is also disposed at a junction of the photosensitive blocks in different colors to distinguish between the photosensitive blocks;
   a third metal layer disposed on the junction region; and
   a transparent conductive layer disposed on the third metal layer,
   wherein the metal substrate has an upper surface which a light absorption layer is disposed on, with the light absorption layer adapted to absorb a reflecting light otherwise reflecting off the metal substrate and the third metal layer and propagating therebetween.

7. The touch-control photosensitive structure for preventing red light leakage according to claim 6, wherein the light absorption layer corresponds in position to the junction region and extends together with the third metal layer along a same vertical extension line of the upper surface of the metal substrate.

8. The touch-control photosensitive structure for preventing red light leakage according to claim 6, wherein the light absorption layer is a metal oxide of the third metal layer.

9. The touch-control photosensitive structure for preventing red light leakage according to claim 6, wherein the light absorption layer is made of one of a black composite and a black matrix.

10. The touch-control photosensitive structure for preventing red light leakage according to claim 6, wherein the light absorption layer is a metal layer made of one of iron, manganese, and chromium.

* * * * *